(12) United States Patent
Caruso et al.

(10) Patent No.: US 6,451,672 B1
(45) Date of Patent: Sep. 17, 2002

(54) METHOD FOR MANUFACTURING ELECTRONIC DEVICES IN SEMICONDUCTOR SUBSTRATES PROVIDED WITH GETTERING SITES

(75) Inventors: Davide Caruso, Tremestieri Etneo; Vito Raineri, Mascalucia; Mario Saggio, Catania; Umberto Stagnitti, Castiglione Di Sicilia, all of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/549,889

(22) Filed: Apr. 17, 2000

(51) Int. Cl.[7] .............................................. H01L 21/322
(52) U.S. Cl. ....................... 438/471; 438/528; 438/445
(58) Field of Search ................................ 438/471, 507, 438/478, 455, 456, 457, 458, 514–517

(56) References Cited

U.S. PATENT DOCUMENTS

| | | | |
|---|---|---|---|
| 5,714,395 A | * | 2/1998 | Bruel .......................... 438/528 |
| 5,840,590 A | | 11/1998 | Myers, Jr. et al. |
| 6,162,705 A | * | 12/2000 | Henley et al. ............... 438/478 |
| 6,168,981 B1 | * | 1/2001 | Battaglia et al. ............ 438/164 |

FOREIGN PATENT DOCUMENTS

| | | |
|---|---|---|
| JP | 05 235005 | 9/1993 |
| JP | 10 32209 | 2/1998 |
| JP | 11 074275 | 3/1999 |

OTHER PUBLICATIONS

Raineri et al., "Gettering of Metals by Voids in Silicon," *Journal of Applied Physics* 78(6):3727–3735, Sep. 15, 1995.

Petersen et al., "Gettering of Transition Metals by Cavities in Silicon Formed by Helium Io Implantation," *Nuclear Instruments and Methods in Physics Research, Section B*, 127–128: 301–306, May 1, 1997.

Zhang et al., "Gettering of Cu by Microcavities in Bonded/Ion–Cut Silicon–on–Insulator and Separation by Implantation of Oxygen," *Journal of Applied Physics* 86(8):4214–4219, Oct. 15, 1999.

Raineri et al., "Lifetime Control in Silicon Devices by Voids Induced by He ion Implantation", *Journal of Applied. Physics* 79 (12), pp. 9012–9016, Jun. 15, 1996.

Battaglia et al., "Gettering of Metals by Voids in Silicon Devices", in *proceedings 24th European Solid State Device Research conference (ESSDERC 94)* — Edinburgh 11 — 15 Sep. 1994, edited by C. Hill and P. Ashburn, (Editions Frontieres, Gif–sur–Yvette, 1994), pp. 403–406.

Raineri et al., "Gettering of Metals by He Induced Voids in Silicon", *Nuclear Instruments and Methods in Physics Research B 96*, pp. 249–252, 1995.

Raineri et al., "Gettering of Metals by Voids in Silicon", *J. Appl. Phys.* 78 (6), pp. 3727–3735, Sep. 15, 1995.

* cited by examiner

*Primary Examiner*—David Nelms
*Assistant Examiner*—Dung Ang Le
(74) *Attorney, Agent, or Firm*—Lisa Jorgenson; Robert Iannucci; Seed IP Law Group PLLC

(57) ABSTRACT

This invention relates to a method for manufacturing electronic devices integrated monolithically in a semiconductor substrate delimited by two opposed front and back surfaces of a semiconductor material wafer. The method comprises at least a step of implanting ions of a noble gas, followed by a thermal treatment directed to form gettering microvoids in the semiconductor by evaporation of the gas. The ion implanting step is carried out through the back surface of the semiconductor wafer prior to starting the manufacturing process for the electronic devices, and also can be before the step of cleaning the front surface of the wafer.

14 Claims, 2 Drawing Sheets

METHOD FOR MANUFACTURING ELECTRONIC DEVICES IN SEMICONDUCTOR SUBSTRATES PROVIDED WITH GETTERING SITES

TECHNICAL FIELD

This invention relates to a method for manufacturing monolithically integrated electronic devices in semiconductor substrates provided with gettering sites, and to a wafer of a semiconductor material for the manufacturing of electronic devices according to the above method.

BACKGROUND OF THE INVENTION

This technical field specifically requires that metal contaminants be removed from substrates of integrated circuits. Unfortunately, metal contaminants are normally found in semiconductor substrates and their presence can seriously affect the performance of integrated circuits formed in such substrates.

The presence of metal impurities is often a source of trouble and malfunction in electronic semiconductor devices. Accordingly, the possibility of clearing the silicon of all metal impurities has been the subject of intensive study and research work in recent years.

To fill this demand, gettering techniques are used which allow electronic devices that are monolithically integrated in a semiconductor to be provided with so-called gettering sites for trapping any metal contaminants present in the semiconductor.

Such gettering sites are created near the end of the processing steps that lead to the formation of integrated circuits. For this purpose, the front side of the semiconductor wafer is coated with a protective layer, and the back side of the wafer is cleaned and subjected to a step of POC13 deposition or phosphorus (P) ion implantation, in order to produce certain extended faults in the semiconductor substrate.

These extended faults in the crystalline structure of the semiconductor effectively function as gettering sites capable of attracting and segregating metal atom impurities, as further described hereinafter.

This gettering technique involves, however, some manufacturing problems, since it is applied at the end of the manufacturing process and can impair the quality of circuits previously formed in the semiconductor wafer. In addition, the gettering efficiency of faults formed in this way is not particularly high.

More recently, the prior art proposed that microvoids be produced in the semiconductor substrate by subjecting it to a step of implanting light ions of a noble gas, such as helium (He). These ions are highly permeable through silicon and implanted at a high concentration ($>5\times10^{15}$ atoms/cm$^2$) and low energy, such that gas bubbles are produced within the crystalline structure.

The energy level at which the implanting step is carried out represents no particular limitation to a successful implantation. In fact, a few keV to tens of MeV may be used. However, as the implanting energy increases, the minimum dosage for bubble formation also increases.

Optimum conditions for forming bubbles through the silicon are achieved at an implanting energy in the 50 to 300 keV range, as described in an article, "Gettering of metals by voids in silicon", Journal of Applied Physics, No. 78(6), Sep. 15, 1995.

At energy levels below that, there occur phenomena of the semiconductor surface exploding, while at higher energy levels, such high implantation dosages must be used that the processing step ceases to be cost-efficient.

A thermal treatment applied after the implanting step, at a temperature above 700° C., allows the gas to diffuse through the crystalline structure up to the semiconductor surface, where it will evaporate.

In evaporating, the gas leaves microvoids in the crystalline structure whose average diameter increases as the process temperature is increased. Also, these microvoids are confined locally within the projection regions of the implanted ions.

It has been found that the microvoids have a fault that is thermally stable in silicon. This means that, even subsequent to thermal treatments applied after the bubble forming, they do not evolve into crystallographic faults of another nature. This phenomenon is described in an article, "Efficiency and thermal stability of Pt gettering in crystalline Si", Journal of Applied Physics, No. 80(8), Oct. 15, 1996.

On the surfaces of the microvoids formed as described above, there appear silicon atoms having unsaturated bonds and being highly reactive to impurities, in particular to such metal impurities as copper (Cu), platinum (Pt), or iron (Fe).

An example of a different application of microvoids produced by implanting He ions is known as a life span controlling technique and described in European Patent Application No. 0694960 by Co.Ri.M.Me., and herein incorporated by reference, which discloses a process for producing microvoids from helium bubbles implanted beneath the active areas of an integrated electronic device.

SUMMARY OF THE INVENTION

Embodiments of the invention provide a process for manufacturing electronic devices which are integrated monolithically in a semiconductor and have self-gettering features, that is, an inherent capability of trapping out metal contaminants from the semiconductor. Specifically, one embodiment of the invention uses steps of implanting noble gas ions into the semiconductor substrate, followed by a thermal treatment to create bubbles through the substrate by evaporation of said gas.

These embodiments are able to provide a semiconductor substrate with self-gettering properties by acting on the back side of a semiconductor wafer incorporating this substrate before the wafer is subjected to the process steps that result in the integrated circuits being formed. The back surface of the semiconductor wafer is pre-treated for the formation of gettering sites, prior to the wafer front polishing step.

Embodiments of the invention include methods for implanting noble gas ions into the back surface of the substrate, followed by a thermal treatment directed to form gettering microvoids in the semiconductor by evaporation of the gas, prior to starting the manufacturing process for electronic devices.

These methods produce a wafer of a semiconductor material for manufacturing electronic devices or circuits integrated in a semiconductor substrate which is bounded by a front surface of the wafer and an opposed back surface thereof. The back surface of the wafer includes gettering sites which have been formed by implanting ions of a noble gas, followed by thermal treatment to form bubbles through the semiconductor by evaporation of the gas.

The features and advantages of the methods according to the invention will be apparent from the following description of an embodiment thereof, given by way of non-limitative example with reference to the accompanying drawings.

DETAILED DESCRIPTION OF THE INVENTION

Figure 1:
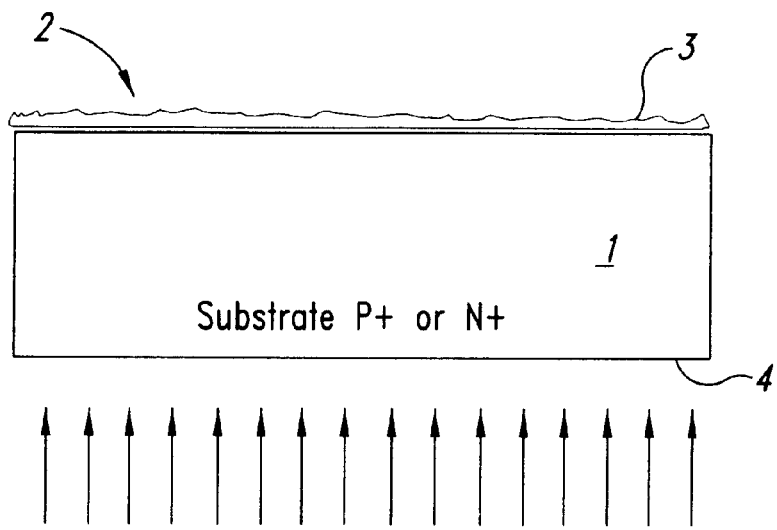
FIG. 1 is a vertical cross sectional view of a portion of a semiconductor substrate as subjected to a step of the method according to an embodiment of the invention.
Figure 2:
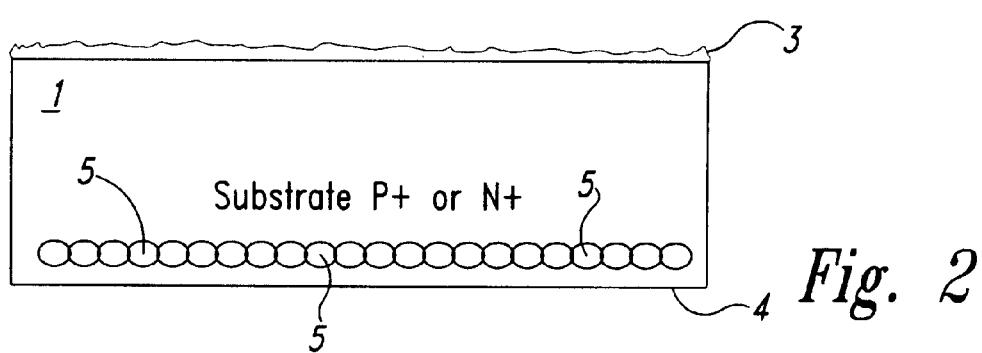
FIGS. 2–4 are cross sectional views of the portion of the semiconductor substrate shown in FIG. 1, in process stages subsequent to that shown in FIG. 1.

Referring to the drawing views, in particular the example of FIG. 1, generally and schematically shown at 1 is a substrate of a semiconductor material, e.g., monocrystalline silicon, which is to be subjected to sequential processing steps according to embodiments of the invention. The process steps and the structures described herein below do not form a complete process flow for manufacturing integrated circuits. In fact, this invention can be practiced jointly with integrated circuit manufacturing techniques currently used in the art, and only those common process steps will be discussed herein as are necessary to an understanding of the invention.

Discussion of processes or structures well known to those skilled in the art has been abbreviated or eliminated for brevity. The drawing figures which show crosssections through a semiconductor wafer are not drawn to scale but rather to highlight major features of the invention.

The substrate 1 is incorporated to a so-called semiconductor wafer 2. The substrate 1 may be doped either P+ or N+. The wafer 2 has a surface 3 referred to as the front surface, which is still raw, in the sense that it will only later receive the pattern of an electronic device or circuit integrated monolithically in the semiconductor.

The wafer 2 has a back surface 4, opposite from the front surface 3. Reference will be made hereinafter to the front 3 and back 4 surfaces by the respective terms of front 3 and back 4 of the wafer 2.

Advantageously in this shown embodiment, the back 4 of the wafer 2 is subjected to ion implantation using ions of a noble gas, e.g., helium (He). This implanting step is carried out at a fairly high dosage, preferably higher than $1 \times 10^{16}$ atoms/cm$^2$. The implantation energy used during this step is of approximately 20 keV, preferably more.

This implantation step is the first step provided for forming microvoids in the semiconductor substrate 1 at the back surface layer 4 of the wafer 2.

This method provides for a subsequent thermal treatment applied at a temperature, referred to as intermediate for this kind of electronic component manufacturing process.

Specifically, the thermal treatment step is carried out at a temperature in the 600° to 800° C. range. Preferably for this thermal treatment, the temperature should be higher than 700° C. and maintained for about one hour in an inert medium of nitrogen ($N_2$).

This thermal step allows the helium ions implanted in the substrate 1 to form bubbles within the crystalline structure of the semiconductor. As the thermal treatment progresses, the helium gas evaporates through the back surface 4 of the wafer 2, and leaves in the substrate an almost unbroken series of voids 5 whose diameters lie in the 10 to 100 nanometer (nm) range.

Figure 3:
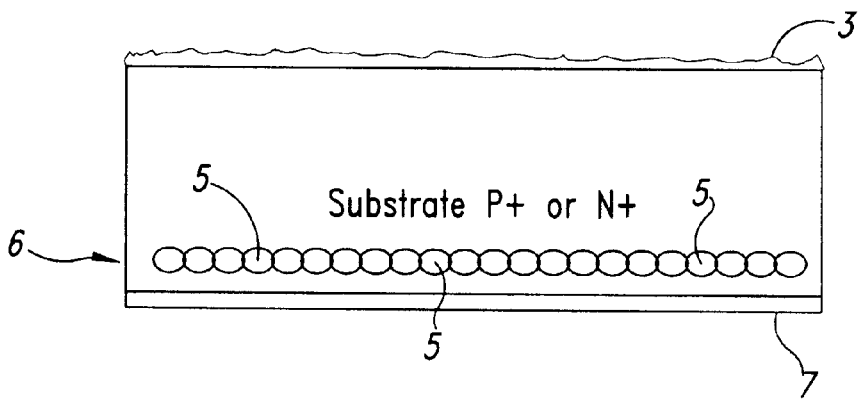

Also, these voids are confined to within a region which extends parallel to the back surface 4 of the wafer 2. This region extends relatively close to the back surface 4 and defines essentially a band 6 located within the substrate 1 and 100 to 500 nm from the surface 4, as shown in FIG. 3.

At this stage of this method, a protective layer 7 is formed over the entire back surface 4 of the wafer 2.

This layer 7 can be formed conventionally by depositing a nitride or polysilicon or silicon dioxide layer using a vapox technique, for instance.

This method further provides for the front 3 of the wafer 2 to be polished, such as by chemical mechanical polishing (CMP), thereby making it ready to accept any standard process for manufacturing semiconductor monolithically integrated circuits.

Produced then is a wafer that incorporates a substrate 1 having self-gettering properties. In essence, wafers produced in accord with embodiments of this invention have a major advantage in that they include thermally stable trapping sites for metal impurities, since the efficiency of the microvoids is left unaltered by high-temperature thermal treatments (T=1200° C., t=5 hr).

This relieves the integrated electronic devices manufacturing process of the steps required to create gettering sites at the end of the device manufacturing steps.

A further embodiment can be obtained by implanting of additional noble gas ions into portions of the front surface 3 of the semiconductor material wafer not covered by the electronic devices thus forming additional gettering microvoids in the front surface 3 of the semiconductor material wafer by evaporating the additional noble gas ions.

Furthermore, the methods of this invention are of special advantage in all those cases where standard techniques cannot be used to provide gettering sites or regions.

An example of such cases would be that of SOI (Silicon-On-Insulator) substrates, which comprise essentially a pair of substrates isolated by an oxide layer.

By virtue of this method yielding a substrate with self-gettering properties, the formation of SOI substrates including gettering sites is made much easier.

In fact, a SOI substrate can be provided by superimposing on each other and bonding together two semiconductor wafers, each with a respective substrate. For example, a first wafer could include a standard substrate, and the second wafer include a substrate according to embodiments of the invention having an insulating protective layer.

The first and second wafers can be superimposed on each other and bonded together such that the insulating layer will form a buried layer of the resultant structure. Alternatively, the insulating layer could well be a protective layer of the first wafer.

In either case, the gettering sites would locate next to the insulating layer of the substrate-insulator-substrate ply, i.e., in the best place to develop an effective gettering action.

Figure 4:
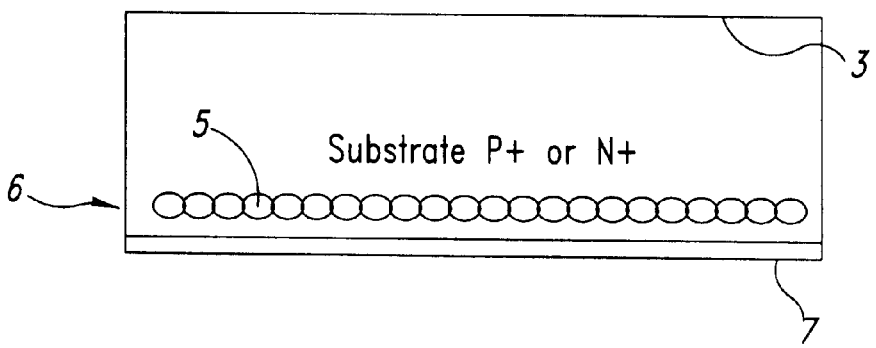
Figure 5:
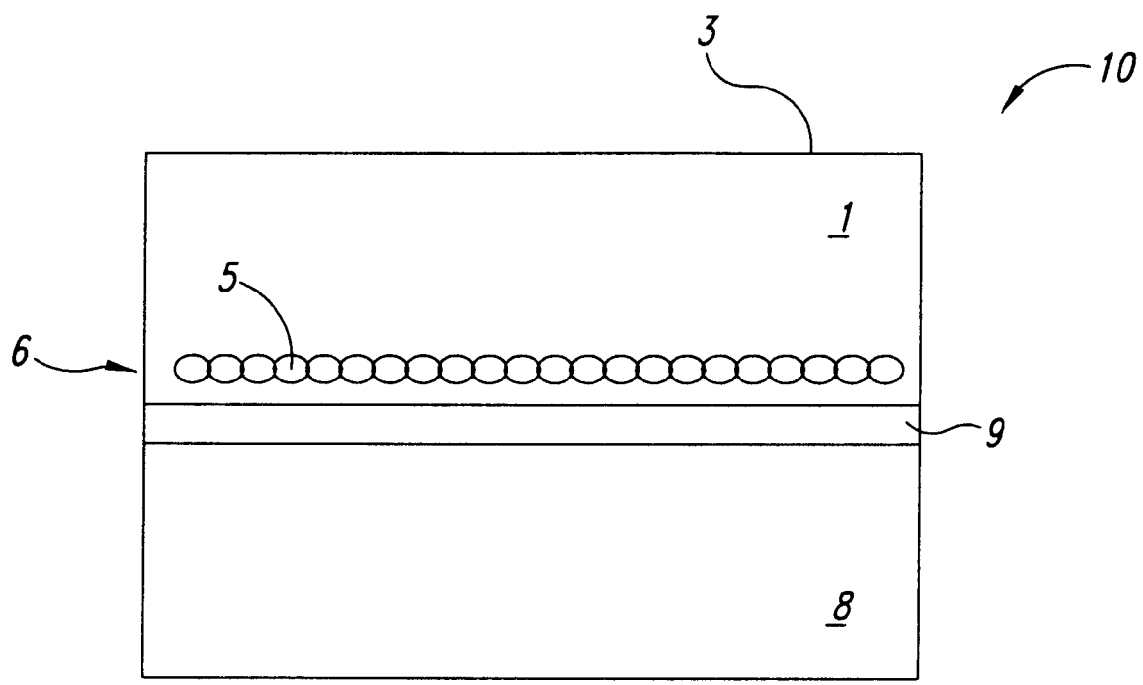
FIG. 5 is a cross sectional view of a further embodiment of the invention.

An example of such an SOI substrate is shown in FIG. 5. In that figure, an SOI substrate 10 is formed of two joined substrates, substrate 1 and a substrate 8. The substrate 1 has been treated with the above procedure, i.e., caused to form the band 6 of the almost unbroken series of voids 5, using steps described above. The substrates 1 and 8 are joined by an insulative layer 9, which may be the same insulative layer 7 shown in FIGS. 3 and 4. The front surface 3 of the SOI substrate 10 can be polished, or left in its rough cut state for further processing.

Tests carried out by the Applicant have shown that methods according to embodiments of this invention are cost-efficient compared to the other techniques currently employed in the industry. In addition, a highly efficient gettering action was achieved along with considerable stability to temperature.

Changes can be made to the invention in light of the above detailed description. In general, in the following claims, the terms used should not be construed to limit the invention to the specific embodiments disclosed in the specification and the claims, but should be construed to include all methods and devices that are in accordance with the claims. Accordingly, the invention is not limited by the disclosure, but instead its scope is to be determined by the following claims.

What is claimed is:

1. A method for manufacturing electronic devices integrated monolithically in a semiconductor substrate delimited by front and back surfaces of a semiconductor material wafer, the method comprising:

implanting noble gas ions into the back surface of the semiconductor material wafer;

forming gettering microvoids in the semiconductor material wafer by evaporating the noble gas ions; and forming the electronic devices on the front surface of the semiconductor material wafer after the gettering microvoids are formed and while the gettering microvoids are present in the wafer.

2. The method according to claim 1, further comprising cleaning the front surface of the semiconductor material wafer after implanting the noble gas ions into the semiconductor material wafer and while the gettering microvoids are present in the wafer.

3. The method according to claim 1, further comprising forming a protective layer over the back surface of the semiconductor material wafer while the gettering microvoids are present in the wafer.

4. The method according to claim 1, further comprising superimposing the semiconductor material wafer on a second semiconductor material wafer to form an SOI type substrate.

5. The method according to claim 1 wherein implanting noble gas ions into the back surface of the semiconductor material wafer comprises implanting the ions at a dosage level higher than $1 \times 10^{16}$ atoms/cm$^2$.

6. The method according to claim 1 wherein implanting noble gas ions into the back surface of the semiconductor material wafer comprises implanting the ions at an implantation energy level equal to or greater than 20 keV.

7. The method according to claim 1 wherein forming gettering microvoids in the semiconductor material wafer by evaporating the noble gas ions comprises thermally treating the semiconductor material wafer at a temperature higher than 700° C., and maintained for about one hour in an inert medium.

8. The method according to claim 1, further comprising:

implanting additional noble gas ions into potions of the front surface of the semiconductor material wafer not covered by the electronic devices; and forming additional gettering microviods in the front surface of the semiconductor material wafer by evaporating the additional gas ions.

9. A method for manufacturing electronic devices in a semiconductor substrate having a first surface and a second surface, the method comprising:

implanting noble gas ions into the second surface of the semiconductor substrate;

evaporating at least some of the noble gas ions from the semiconductor substrate to form gettering microvoids in the semiconductor substrate proximal to the second surface;

covering the second surface of the semiconductor substrate with a barrier layer; and forming the electronic devices on the first surface of the semiconductor substrate while the gettering microvoids are present in the wafer.

10. The method according to claim 9, further comprising polishing the first surface of the semiconductor substrate in preparation of device formation after covering the second surface of the semiconductor substrate with a barrier layer and while the gettering microvoids are present in the wafer.

11. The method according to claim 9, wherein covering the second surface of the semiconductor substrate with a barrier layer comprises forming a nitride layer on the second surface of the semiconductor surface using a vapox technique and while the gettering microvoids are present in the wafer.

12. The method according to claim 9 wherein implanting noble gas ions into the second surface of the semiconductor substrate comprises implanting helium ions at a dosage level higher than $1 \times 10^{16}$ atoms/cm$^2$ and at an implantation energy level equal or greater than 20 keV.

13. The method according to claim 9 wherein evaporating at least some of the noble gas ions from the semiconductor substrate to form gettering microvoids in the semiconductor substrate comprises heating the semiconductor substrate to a temperature higher than 700° C., for an hour in an inert medium.

14. The method according to claim 9, further comprising:

implanting additional noble gas ions into portions of the first surface of the semiconductor substrate wafer not covered by the electronic devices; and forming additional gettering microvoids in the first surface of the semiconductor substrate by evaporating at least some of the additional noble gas ions.

* * * * *

UNITED STATES PATENT AND TRADEMARK OFFICE
CERTIFICATE OF CORRECTION

PATENT NO. : 6,451,672 B1
DATED : September 17, 2002
INVENTOR(S) : Davide Caruso et al.

It is certified that error appears in the above-identified patent and that said Letters Patent is hereby corrected as shown below:

<u>Title page,</u>
Item [30], the Foreign Application Priority Data should read as:

-- April 15, 1999     (EP) ...............99830216.0 --.

Signed and Sealed this

Eighteenth Day of February, 2003

JAMES E. ROGAN
*Director of the United States Patent and Trademark Office*